(12) United States Patent
Shen et al.

(10) Patent No.: US 12,431,356 B2
(45) Date of Patent: Sep. 30, 2025

(54) METAL GATE STRUCTURE AND METHOD OF FORMING THE SAME

(71) Applicant: TAIWAN SEMICONDUCTOR MANUFACTURING COMPANY, LTD., Hsinchu (TW)

(72) Inventors: Tsung-Han Shen, Taoyuan (TW); Kevin Chang, New Taipei (TW); Yu-Ming Li, Hsinchu (TW); Chih-Hsiang Fan, Hsinchu (TW); Yi-Ting Wang, Kaohsiung (TW); Wei-Chin Lee, Taipei (TW); Hsien-Ming Lee, Changhua (TW); Chien-Hao Chen, Llan County (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 534 days.

(21) Appl. No.: 17/832,578

(22) Filed: Jun. 4, 2022

(65) Prior Publication Data

US 2023/0282482 A1 Sep. 7, 2023

Related U.S. Application Data

(60) Provisional application No. 63/316,065, filed on Mar. 3, 2022.

(51) Int. Cl.
*H01L 21/28* (2025.01)
*H01L 29/49* (2006.01)
(Continued)

(52) U.S. Cl.
CPC ..... *H01L 21/28088* (2013.01); *H10D 30/024* (2025.01); *H10D 30/6211* (2025.01); *H10D 64/667* (2025.01)

(58) Field of Classification Search
CPC ..... H10D 30/6211; H10D 30/62–6219; H10D 30/024–0245; H10D 64/667;
(Continued)

(56) References Cited

U.S. PATENT DOCUMENTS 8,772,109 B2 7/2014 Colinge
8,785,285 B2 7/2014 Tsai et al.
(Continued)

FOREIGN PATENT DOCUMENTS

KR 20200049505 A 5/2020
KR 20200135724 A 12/2020
(Continued)

*Primary Examiner* — Steven B Gauthier
*Assistant Examiner* — Rhys Poniente Sheker
(74) *Attorney, Agent, or Firm* — HAYNES AND BOONE, LLP

(57) ABSTRACT

A method of manufacturing a semiconductor device includes forming a gate trench over a semiconductor substrate, depositing a gate dielectric layer and a work function layer in the gate trench, depositing a capping layer over the work function layer, passivating a surface portion of the capping layer to form a passivation layer, removing the passivation layer, depositing a fill layer in the gate trench, recessing the fill layer and the capping layer, and forming a contact metal layer above the capping layer in the gate trench.

20 Claims, 14 Drawing Sheets

(51) Int. Cl.
*H01L 29/66* (2006.01)
*H01L 29/78* (2006.01)
*H10D 30/01* (2025.01)
*H10D 30/62* (2025.01)
*H10D 64/66* (2025.01)

(58) Field of Classification Search
CPC ....... H10D 64/117; H10F 99/00; H10F 55/20; H01L 21/28088
See application file for complete search history.

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2017/0125536 A1* | 5/2017 | Chen | H01L 21/324 |
| 2018/0175201 A1* | 6/2018 | Wang | H10D 30/024 |
| 2019/0006242 A1* | 1/2019 | Wang | H10D 84/834 |
| 2020/0343362 A1* | 10/2020 | Wu | H01L 29/4983 |
| 2021/0119034 A1 | 4/2021 | Lian et al. | |
| 2021/0335613 A1 | 10/2021 | Chiang et al. | |
| 2021/0343851 A1 | 11/2021 | Wang et al. | |

FOREIGN PATENT DOCUMENTS

| | | |
|---|---|---|
| KR | 20210098308 A | 8/2021 |
| KR | 20210154698 A | 12/2021 |
| KR | 20220022085 A | 2/2022 |
| TW | 200915439 A | 4/2009 |
| TW | 202141632 A | 11/2021 |
| TW | 202145502 A | 12/2021 |

* cited by examiner

METAL GATE STRUCTURE AND METHOD OF FORMING THE SAME

PRIORITY DATA

This application claims priority to U.S. Provisional Patent Application No. 63/316,065 filed on Mar. 3, 2022, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement implemented as technology nodes shrink, in some IC designs, has been the replacement of a polysilicon gate with a metal gate to improve device performance with the decreased feature sizes. One process of forming a metal gate is termed a replacement gate or "gate-last" process in which the metal gate is fabricated "last" which allows for reduced number of subsequent processes. A "gate-last" process may include a metal gate gap-filling process and a metal gate etch-back process. In the metal gate gap-filling process, various metal layers, such as work function metal layers and metal fill layers, are sequentially deposited in a gate trench that is formed in a place reserved by a dummy gate. In the metal gate etch-back process, the various layers formed in the gate trench is etched back to spare space for forming gate metal cap. However, there are challenges to implementing such IC fabrication processes, especially with scaled down IC features in advanced process nodes. One challenge is that voids, or referred to as seams for their generally high aspect ratio, may be trapped in the gate trench during the metal gate gap-filling process. The voids may introduce punch-through defects during the metal gate etch-back process and cause poor growth of gate metal cap. While the current methods have been satisfactory in many respects, as transistor dimensions are continually scaled down to sub-10 nm technology nodes, further improvements of metal gate formation are still needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
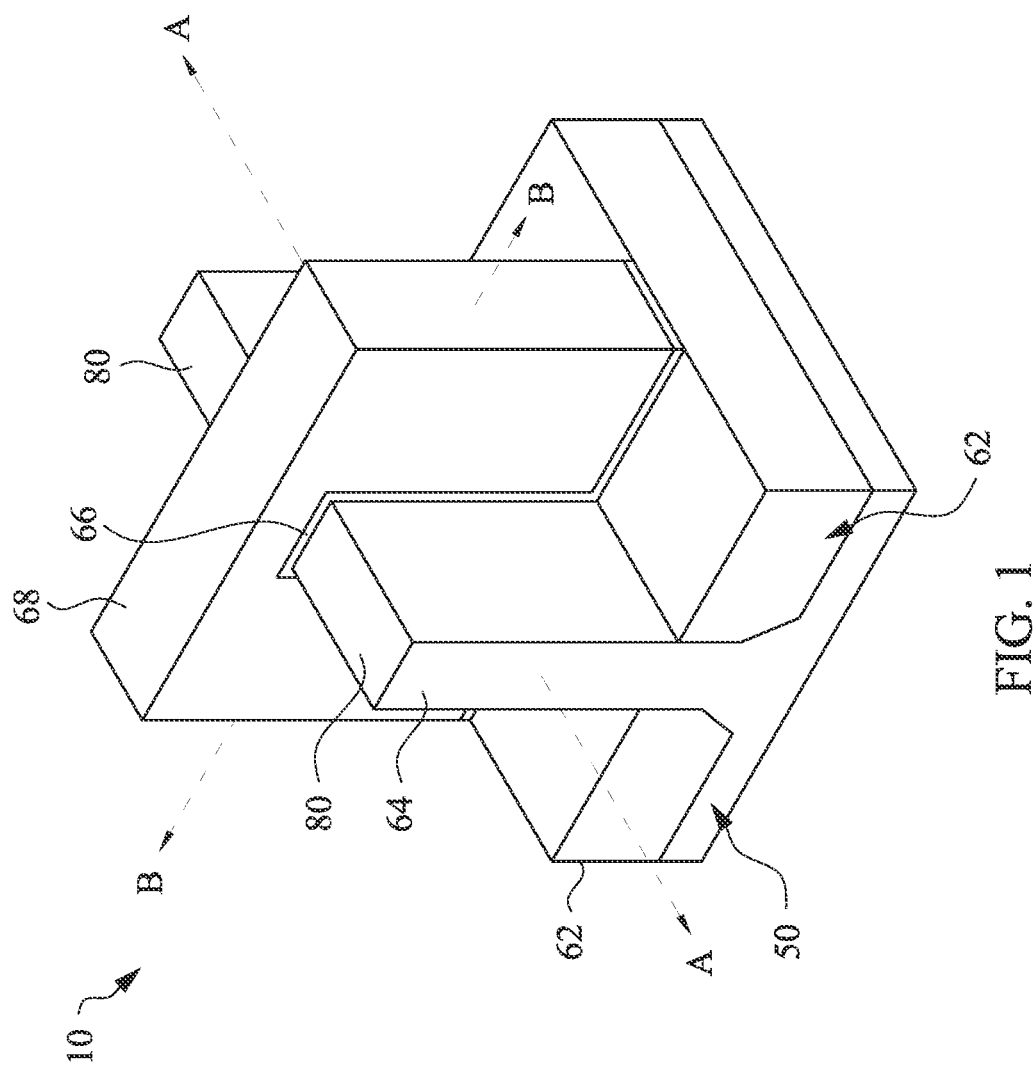
FIG. 1 illustrates a perspective view of a multi-gate transistor, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

Embodiments of the present disclosure provide an improved metal gate formation process, which may be employed in any of a variety of device types. For example, embodiments of the present disclosure may be used to form gate stacks suitable for use in planar bulk metal-oxide-semiconductor field-effect transistors (MOSFETs), multi-gate transistors (planar or vertical) such as FinFET devices, gate-all-around (GAA) transistor devices, a vertical transistor devices, as well as strained-semiconductor devices, silicon-on-insulator (SOI) devices, partially-depleted SOI devices, fully-depleted SOI devices, or the like. In addition, embodiments disclosed herein may be employed in the formation of P-type and/or N-type devices.

With transistor dimensions are continually scaled down to sub-10 nm technology nodes and below, a gate trench reserved by a dummy gate over a fin-like structure, including a fin for a FinFET device or a stack of channel layers for a GAA device, may have a high aspect ratio and/or a necking profile. Throughout the description, the terms "fin-like structure" and "fin" are interchangeably used for the sake of simplicity.

The fins may be patterned by any suitable method. For example, the fins may be patterned using one or more photolithography processes, including double-patterning or multi-patterning processes. The double-patterning or the multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

When various metal layers are sequentially deposited in the gate trench, seams (or voids) may be easily trapped in the gate trench due to the high aspect ratio and/or the necking profile of the gate trench. During the metal gate etch-back process, etchants may leak into the seams and cause uneven etching of the metal layers, resulting in punch-through defects and poor growth of gate metal cap. In accordance with some embodiments, after a capping layer is deposited over a work function metal (WFM) layer, a gradient passivation process (e.g., a gradient oxidation process) is performed to passivate a surface portion of the capping layer. The passivated surface portion has a larger thickness near the opening of the gate trench and a smaller thickness near the bottom of the gate trench due to the gradient passivation process. The passivated surface portion is subsequently removed in a selective etch process. The removal of the passivated surface portion transforms a previous re-entrant profile of the gate trench to a U-shape (or V-shape) profile with enlarged openings. The enlarged opening facilitates subsequent gap-filling layer deposition to fill the gate trench without trapping seams (or less seams). The proposed metal gate formation process improves uniformity and integrity of gate metal layers and thus leads to better performance of the transistors.

FIG. 1 illustrates an example of a multi-gate transistor, such as a FinFET 10, in a perspective view. The FinFET 10 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate 68 is over the gate dielectric 66. Source/drain regions 80 are in the fin 64 and on opposing sides of the gate dielectric 66 and the gate 68. Source/drain region(s) may refer to a source or a drain, individually or collectively dependent upon the context. FIG. 1 further illustrates reference cross-sections that are used in subsequent figures. Cross-section B-B extends along a longitudinal axis of the gate 68 of the FinFET 10. Cross-section A-A is perpendicular to cross-section B-B and is along a longitudinal axis of the fin 64 and in a direction of, for example, a current flow between the source/drain regions 80. Subsequent figures refer to these reference cross-sections for clarity.

Figure 2:
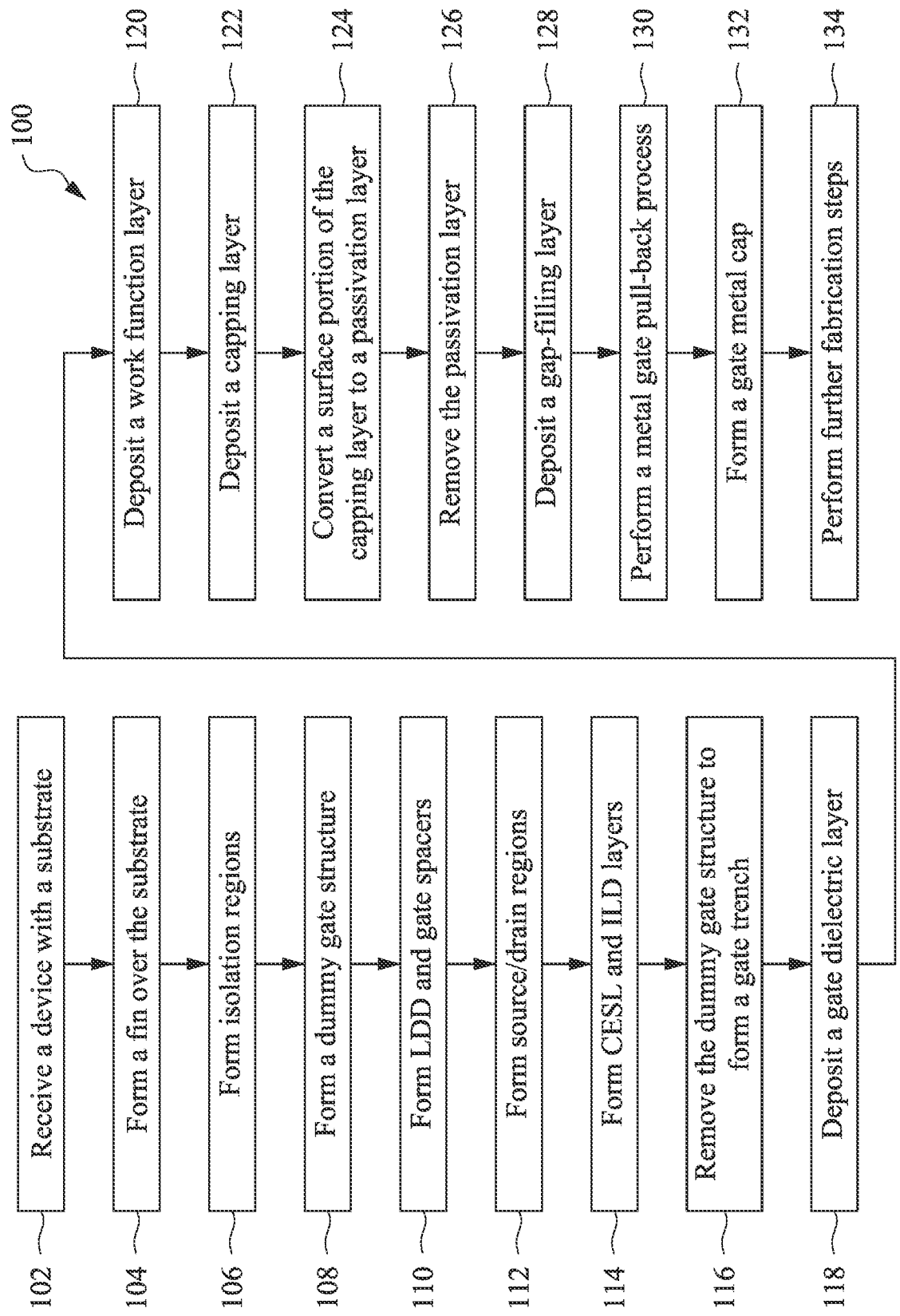
FIG. 2 illustrates a flow chart of an example method for making a multi-gate transistor device, in accordance with some embodiments.

FIG. 2 illustrates a flowchart of a method 100 to form a non-planar transistor device, according to one or more embodiments of the present disclosure. For example, at least some of the operations of the method 100 can be used to form a FinFET device, a GAA transistor device, a vertical transistor device, or the like. It is noted that the method 100 is merely an example, and is not intended to limit the present disclosure. Accordingly, it is understood that additional operations may be provided before, during, and after the method 100 of FIG. 2, and that some other operations may only be briefly described herein. In some embodiments, operations of the method 100 may be associated with cross-sectional views of an example semiconductor device 200 (or device 200) at various fabrication stages as shown in FIGS. 3-24, which will be discussed in further detail below.

FIGS. 3-24 each illustrate, in a cross-sectional view, a portion of a device 200 at various stages of the method 100 of FIG. 2. In the illustrated embodiments, the device 200 is similar to the FinFET device 10 shown in FIG. 1, in which channel region of a transistor is provided by a fin that continuously protrudes from a substrate. In various other embodiments, the device 200 may include a transistor with channel region provided by a plurality of nanosheet or nanowires vertically stacked above a substrate, such as a GAA transistor. FIGS. 3-6 illustrate cross-sectional views of the device 200 along cross-section B-B. FIGS. 7-24 illustrate cross-sectional views of the device 200 along cross-section A-A.

Figure 3:
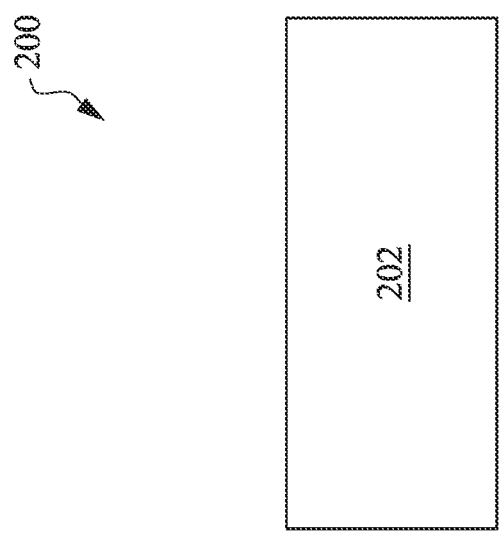

Corresponding to operation 102 of FIG. 2, FIG. 3 illustrates a cross-sectional view of the device 200 including a semiconductor substrate 202 (or substrate 202) at one of the various stages of fabrication. The substrate 202 may be a semiconductor substrate, such as a bulk semiconductor, a semiconductor-on-insulator (SOI) substrate, or the like, which may be doped (e.g., with a p-type or an n-type dopant) or undoped. The substrate 202 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
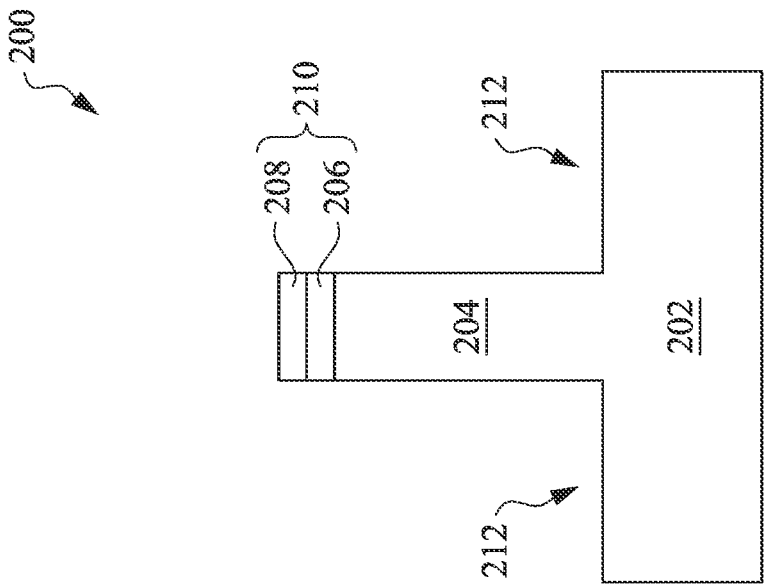
FIGS. 3, 4, 5, 6, 7, 8, 9, 10, 11, 12, 13, 14, 15, 16, 17, 18, 19, and 20 illustrate cross-sectional views of an example multi-gate transistor device during various fabrication stages, made by the method of FIG. 2, in accordance with some embodiments.

Corresponding to operation 104 of FIG. 2, FIG. 4 is a cross-sectional view of the device 200 including a (semiconductor) fin 204 at one of the various stages of fabrication. Although one fin is shown in the illustrated embodiment of FIG. 4 (and the following figures), it should be appreciated that the device 200 can include any number of fins while remaining within the scope of the present disclosure. In some embodiments, the fin 204 is formed by patterning the substrate 202 using, for example, photolithography and etching techniques. For example, a mask layer, such as a pad oxide layer 206 and an overlying pad nitride layer 208, is formed over the substrate 202. The pad oxide layer 206 may be a thin film comprising silicon oxide formed, for example, using a thermal oxidation process. The pad oxide layer 206 may act as an adhesion layer between the substrate 202 and the overlying pad nitride layer 208. In some embodiments, the pad nitride layer 208 is formed of silicon nitride, silicon oxynitride, silicon carbo nitride, the like, or combinations thereof. The pad nitride layer 208 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 206 and pad nitride layer 208 to form a patterned mask 210, as illustrated in FIG. 4.

The patterned mask 210 is subsequently used to pattern exposed portions of the substrate 202 to form trenches (or openings) 212, thereby defining a fin 204 between adjacent trenches 212 as illustrated in FIG. 4. When multiple fins are formed, such a trench may be disposed between any adjacent ones of the fins. In some embodiments, the fin 204 is formed by etching trenches in the substrate 202 using, for example, reactive ion etch (RIE), neutral beam etch (NBE), the like, or combinations thereof. The etching may be anisotropic. In some embodiments, the trenches 212 may be strips (viewed from the top) parallel to each other, and closely spaced with respect to each other. In some embodiments, the trenches 212 may be continuous and surround the fin 204.

The fin 204 may be patterned by any suitable method. For example, the fin 204 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

Figure 5:
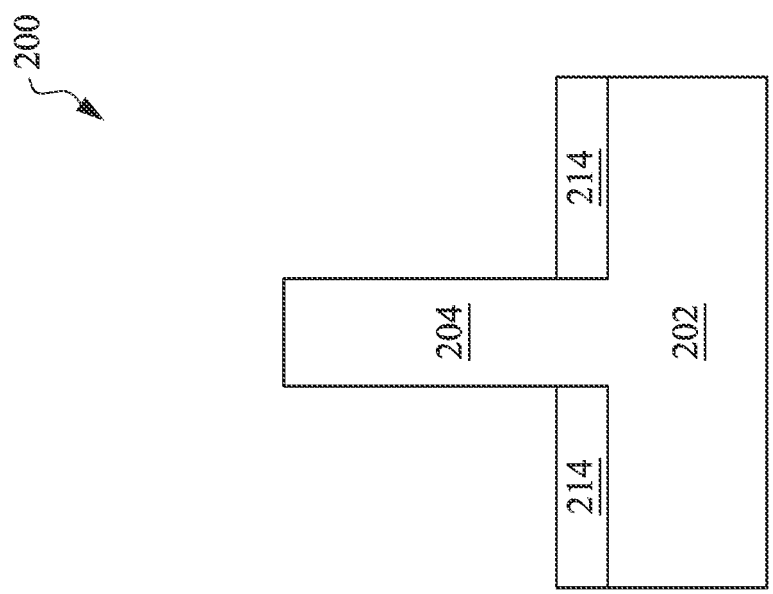

Corresponding to operation 106 of FIG. 2, FIG. 5 is a cross-sectional view of the device 200 including isolation regions 214 at one of the various stages of fabrication. The isolation regions 214, which are formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 214 and a top surface of the fin 204 that are coplanar (not shown, the isolation regions 214 will be recessed as shown in FIG. 5). The patterned mask 210 (FIG. 4) may also be removed by the planarization process.

In some embodiments, the isolation regions 214 include a liner, e.g., a liner oxide (not shown), at the interface between the isolation region 214 and the substrate 202 (fin 204). In some embodiments, the liner oxide is formed to reduce crystalline defects at the interface between the substrate 202 and the isolation region 214. Similarly, the liner oxide may also be used to reduce crystalline defects at the interface between the fin 204 and the isolation region 214. The liner oxide (e.g., silicon oxide) may be a thermal oxide formed through a thermal oxidation of a surface layer of substrate 202, although other suitable method may also be used to form the liner oxide.

Next, the isolation regions 214 are recessed to form shallow trench isolation (STI) regions 214, as shown in FIG. 5. The isolation regions 214 are recessed such that the upper portions of the fin 204 protrude from between neighboring STI regions 214. The top surfaces of the STI regions 214 may have a flat surface (as illustrated), a convex surface, a concave surface (such as dishing), or a combination thereof. The top surfaces of the STI regions 214 may be formed flat, convex, and/or concave by an appropriate etch. The isolation regions 214 may be recessed using an acceptable etching process, such as one that is selective to the material of the isolation regions 214. For example, a dry etch or a wet etch using dilute hydrofluoric (DHF) acid may be performed to recess the isolation regions 214.

FIGS. 3 through 5 illustrate an embodiment of forming one or more fins (such as the fin 204), but a fin may be formed in various different processes. For example, a top portion of the substrate 202 may be replaced by a suitable material, such as an epitaxial material suitable for an intended type (e.g., N-type or P-type) of semiconductor devices to be formed. Thereafter, the substrate 202, with epitaxial material on top, is patterned to form the fin 204 that includes the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in-situ doped during growth, which may obviate prior and subsequent implantations although in situ and implantation doping may be used together. Still further, it may be advantageous to epitaxially grow a material in an NMOS region different from the material in a PMOS region. In various embodiments, the fin 204 may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6:
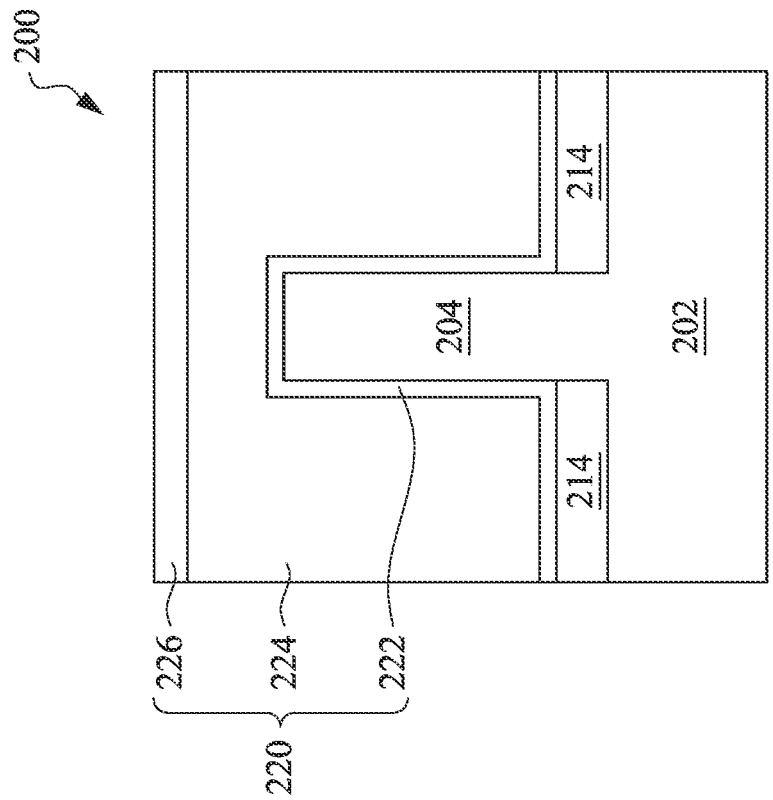

Corresponding to operation 108 of FIG. 2, FIG. 6 is a cross-sectional view of the device 200 including a dummy gate structure 220 at one of the various stages of fabrication. The dummy gate structure 220 includes a dummy gate dielectric 222 and a dummy gate electrode 224, in some embodiments. A mask 226 may be formed over the dummy gate structure 220. To form the dummy gate structure 220, a dielectric layer is formed on the fin 204. The dielectric layer may be, for example, silicon oxide, silicon nitride, multilayers thereof, or the like, and may be deposited or thermally grown.

A gate electrode layer is formed over the dielectric layer, and a mask layer is formed over the gate electrode layer. The gate electrode layer may be deposited over the dielectric layer and then planarized, such as by a CMP. The mask layer may be deposited over the gate electrode layer. The gate electrode layer may be formed of, for example, polysilicon, although other materials may also be used. The mask layer may be formed of, for example, silicon nitride or the like.

After the layers (e.g., the dielectric layer, the gate electrode layer, and the mask layer) are formed, the mask layer may be patterned using acceptable photolithography and etching techniques to form the mask 226. The pattern of the mask 226 then may be transferred to the gate electrode layer and the dielectric layer by an acceptable etching technique to form the dummy gate electrode 224 and the underlying dummy gate dielectric 222, respectively. The dummy gate electrode 224 and the dummy gate dielectric 222 cover a central portion (e.g., a channel region) of the fin 204. The dummy gate electrode 224 may also have a lengthwise direction (e.g., direction B-B of FIG. 1) substantially perpendicular to the lengthwise direction (e.g., direction of A-A of FIG. 1) of the fin 204.

The dummy gate dielectric 222 is shown to be formed over the fin 204 (e.g., over top surfaces and sidewalls of the fin 204) and over the STI regions 214 in the example of FIG. 6. In other embodiments, the dummy gate dielectric 222 may be formed by, e.g., thermal oxidization of a material of the fin 204, and therefore, may be formed over the fin 204 but not over the STI regions 214. It should be appreciated that these and other variations are still included within the scope of the present disclosure.

FIGS. 7-24 illustrate the cross-sectional views of further processing of the device 200 along cross-section A-A (along a longitudinal axis of the fin 204).

Figure 7:
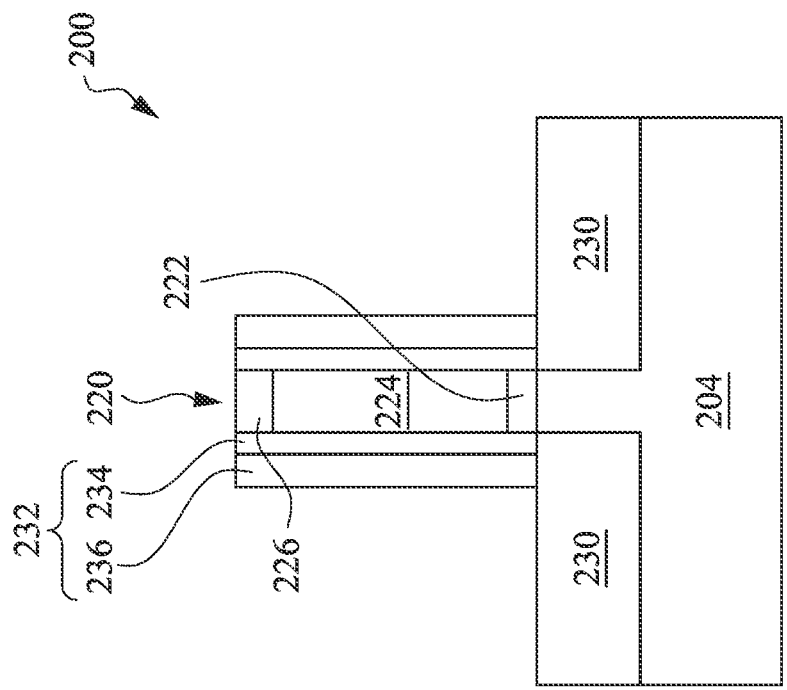

Corresponding to operation 110 of FIG. 2, FIG. 7 is a cross-sectional view of the device 200 including a number of lightly doped drain (LDD) regions 230 formed in the fin 204 at one of the various stages of fabrication. The LDD regions 230 may be formed by a plasma doping process. The plasma doping process may include forming and patterning masks such as a photoresist to cover the regions of the device 200 that are to be protected from the plasma doping process. The plasma doping process may implant N-type or P-type impurities in the fin 204 to form the LDD regions 230. For example, P-type impurities, such as boron, may be implanted in the fin 204 to form the LDD regions 230 for a P-type device. In another example, N-type impurities, such as phosphorus, may be implanted in the fin 204 to form the LDD regions 230 for an N-type device. In some embodiments, the LDD regions 230 abut one of the channel regions of the device 200 (e.g., the central portion of the fin 204 overlaid by one of the dummy gate structures 220). Portions of the LDD regions 230 may extend under the dummy gate structure 220 and into the channel region of the device 200. FIG. 7 illustrates a non-limiting example of the LDD regions 230. Other configurations, shapes, and formation methods of the LDD regions 230 are also possible and are fully intended to be included within the scope of the present disclosure. For example, the LDD regions 230 may be formed after gate spacers 232, which will be discussed below, are formed. In some embodiments, the LDD regions 230 are omitted.

Still referring to FIG. 7, after the LDD regions 230 are formed, in some embodiments, first gate spacer 234 are formed around (e.g., along and contacting the sidewalls of) the dummy gate structures 220, and second gate spacer 236 are formed around (e.g., along and contacting the sidewalls of) the first gate spacer 234. For example, the first gate spacer 234 may be formed on opposing sidewalls of the dummy gate structure 220. The second gate spacer 236 may be formed on the first gate spacer 234. It should be understood that any number of gate spacers can be formed around the dummy gate structures 220 while remaining within the scope of the present disclosure. The first gate spacer 234 and the second gate spacer 236 are collectively referred to as gate spacers 232. The shapes and formation methods of the gate spacers 232 as illustrated in FIG. 7 (and the following figures) are merely non-limiting examples, and other shapes and formation methods are possible. These and other variations are fully intended to be included within the scope of the present disclosure.

The first gate spacer 234 may be a low-k spacer and may be formed of a suitable dielectric material, such as silicon oxide, silicon oxycarbonitride, or the like. The second gate spacer 236 may be formed of a nitride, such as silicon nitride, silicon oxynitride, silicon carbonitride, the like, or combinations thereof. Any suitable deposition method, such as thermal oxidation, chemical vapor deposition (CVD), or the like, may be used to form the first gate spacer 234 and the second gate spacer 236. In accordance with various embodiments, the first gate spacer 234 and the second gate spacer 236 are formed of different materials to provide etching selectivity in subsequent processing.

Figure 8:
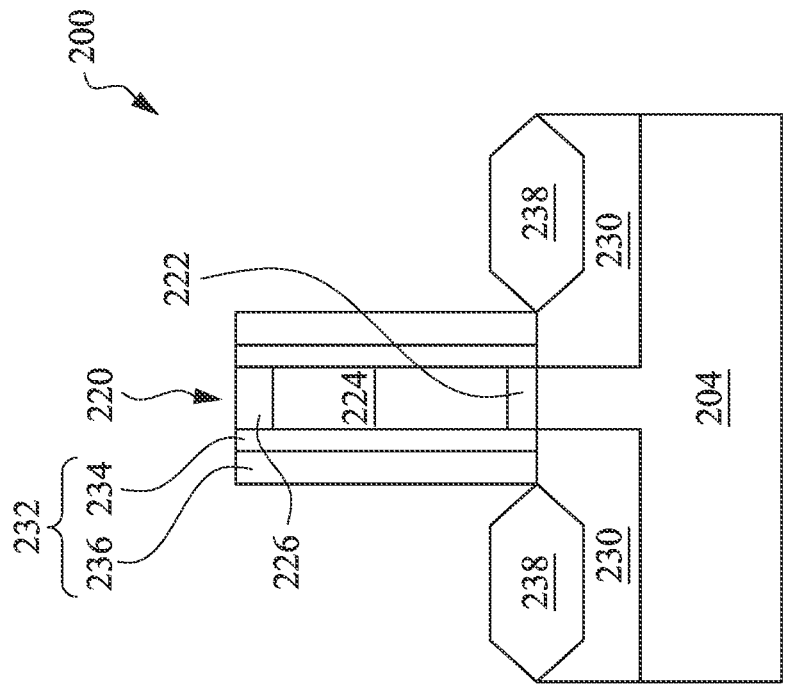

Corresponding to operation 112 of FIG. 2, FIG. 8 is a cross-sectional view of the device 200 including a number of source/drain regions 238 at one of the various stages of fabrication. The source/drain regions 238 are formed in recesses of the fin 204 adjacent to the dummy gate structures 220. For example, the source/drain regions 238 and the dummy gate structures 220 are alternately arranged. In other words, one source/drain region 238 is sandwiched between adjacent dummy gate structures 220 and/or merely one side of the source/drain region 238 is disposed next to a dummy gate structure 220. The recesses are formed by, e.g., an anisotropic etching process using the dummy gate structures 220 as an etching mask, in some embodiments, although any other suitable etching process may also be used.

The source/drain regions 238 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 8, the epitaxial source/drain regions 238 may have surfaces raised from respective surfaces of the fin 204 (e.g. raised above the non-recessed portions of the fin 204) and may have facets. In some embodiments, the source/drain regions 238 of the adjacent fins may merge to form a continuous epitaxial source/drain region (not shown). In some embodiments, the source/drain regions 238 of the adjacent fins may not merge together and remain separate source/drain regions 238 (not shown). In some embodiments, when the resulting device is an N-type transistor, the source/drain regions 238 can include silicon carbide (SiC), silicon phosphorous (SiP), phosphorous-doped silicon carbon (SiCP), or the like. In some embodiments, when the resulting device is a P-type transistor, the source/drain regions 238 comprise SiGe, and a p-type impurity such as boron or indium.

The epitaxial source/drain regions 238 may be implanted with dopants to form source/drain regions 238 followed by an annealing process. The implanting process may include forming and patterning masks such as a photoresist to cover the regions of the device 200 that are to be protected from the implanting process. The source/drain regions 238 may have an impurity (e.g., dopant) concentration in a range from about $1\times10^{19}$ cm$^{-3}$ to about $1\times10^{21}$ cm$^{-3}$. P-type impurities, such as boron or indium, may be implanted in the source/drain region 238 of a P-type transistor. N-type impurities, such as phosphorous or arsenide, may be implanted in the source/drain regions 238 of an N-type transistor. In some embodiments, the epitaxial source/drain regions 238 may be in-situ doped during their growth.

Figures 9, 10:
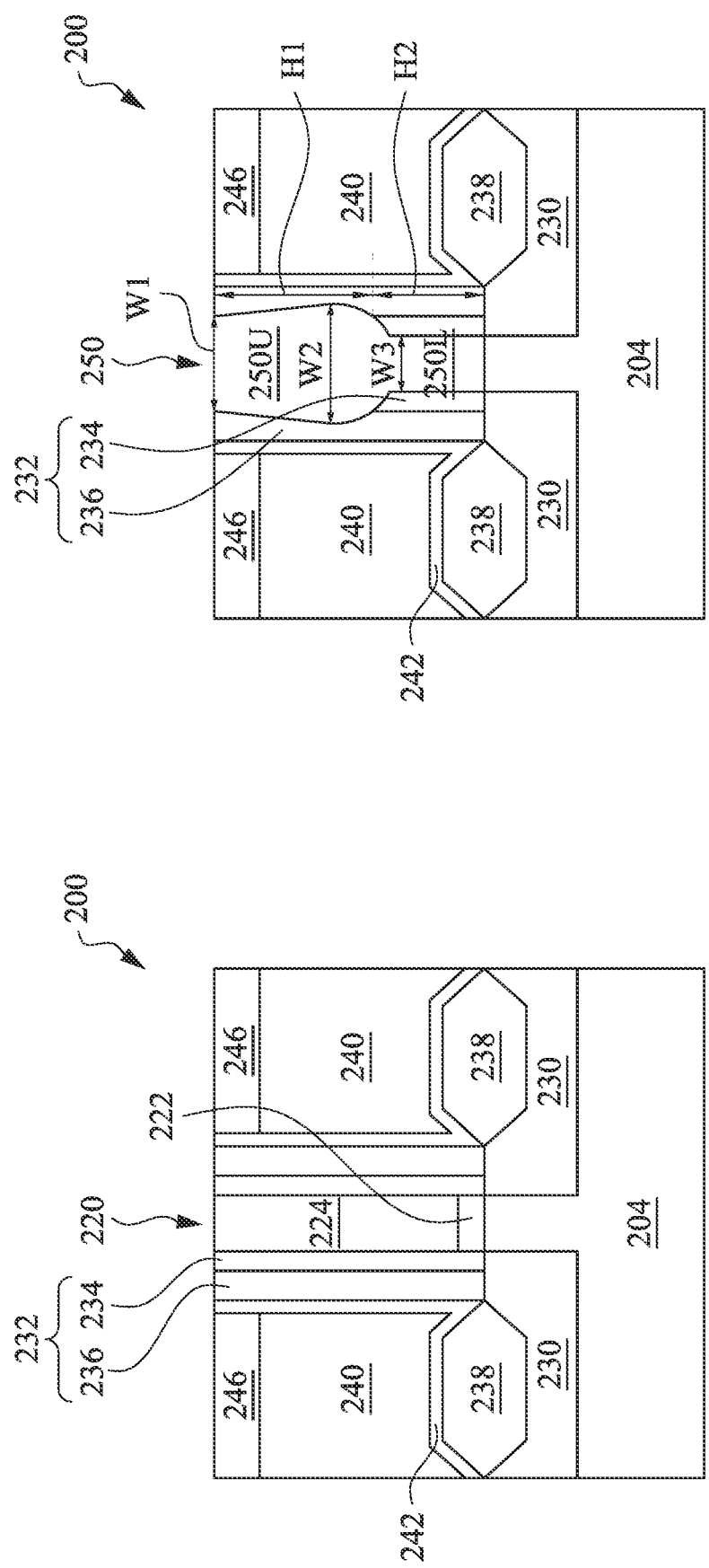

Corresponding to operation 114 of FIG. 2, FIG. 9 is a cross-sectional view of the device 200 including an interlayer dielectric (ILD) 240 at one of the various stages of fabrication. In some embodiments, prior to forming the ILD 240, a contact etch stop layer (CESL) 242 is formed over the structure illustrated in FIG. 9. The CESL 242 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 240 is formed over the CESL 242 and over the dummy gate structure 220. In some embodiments, the ILD 240 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 240 is formed, a dielectric layer 246 is formed over the ILD 240. The dielectric layer 246 can function as a protection layer to prevent or reduces the loss of the ILD 240 in subsequent etching processes. The dielectric layer 246 may be formed of a suitable material, such as silicon nitride, silicon carbonitride, or the like, using a suitable method such as CVD, PECVD, or FCVD. After the dielectric layer 246 is formed, a planarization process, such as a CMP process, may be performed to achieve a level upper surface for the dielectric layer 246. The CMP may also remove the mask 226 and portions of the CESL 242 disposed over the dummy gate electrode 224. After the planarization process, the upper surface of the dielectric layer 246 is level with the upper surface of the dummy gate electrode 224, in some embodiments.

An example gate-last process (sometimes referred to as replacement gate process) is performed subsequently to replace the dummy gate electrode 224 and the dummy gate dielectric 222 of the dummy gate structure 220 with a metal gate (which may also be referred to as a replacement gate or an active gate).

Corresponding to operation 116 of FIG. 2, FIG. 10 is a cross-sectional view of the device 200 in which the dummy gate structure 220 (FIG. 9) is removed to form gate trench 250 at one of the various stages of fabrication. During the removal of the dummy gate structure 220, the first gate spacer 234 and the second gate spacer 236 may also be partially etched, such that upper portion of the gate trench 250 is horizontally expanded by removing relative upper portions of the first gate spacer 234 and the second gate spacer 236. The resultant gate trench 250 has an upper trench 250U and a lower trench 250L, where the upper trench 250U is wider than the lower trench 250L horizontally. Details of forming the gate trench 250 will be discussed below.

In some embodiments, to remove the dummy gate structure 220, one or more etching steps are performed to remove the dummy gate electrode 224 and the dummy gate dielectric 222 directly under the dummy gate electrode 224, so that the gate trenches 250 (which may also be referred to as recesses) are formed between respective first gate spacers 234. The gate trench 250 exposes the channel region of the fin 204. During the dummy gate removal, the dummy gate dielectric 222 may be used as an etch stop layer when the dummy gate electrode 224 is etched. The dummy gate dielectric 222 may then be removed after the removal of the dummy gate electrode 224.

Next, an anisotropic etching process, such as a dry etch process, is performed to remove upper portions of the first gate spacer 234. In some embodiments, the anisotropic etching process is performed using an etchant that is selective to (e.g., having a higher etching rate for) the material of the first gate spacer 234, such that the first gate spacer 234 is recessed (e.g., upper portions removed). The recessed first gate spacer 234 exposes upper sidewalls of the second gate spacer 236. The second gate spacer 236 may also suffer etch loss due to limited etch selectivity of the etchant, such that the exposed upper sidewalls are laterally recessed. The lateral recess of the exposed upper sidewalls of the second gate spacer 236 may not be even, such as due to loading effects. As illustrated in FIG. 10, a portion of the exposed upper sidewalls of the second gate spacer 236 located in the middle of the gate trench 250 is laterally recessed more than other portions.

As illustrated in FIG. 10, after the upper portions of the first gate spacers 234 are removed, the gate trench 250 has an upper trench 250U and a lower trench 250L. The lower trench 250L is between the remaining lower portions of the first gate spacer 234. The upper trench 250U is over the lower trench, and is defined (e.g., bordered) by the exposed upper sidewalls of the second gate spacer 236. The gate trench 250 has a wider upper trench 250U and a narrow lower trench 250L, which resembles the letter "Y," and therefore, the gate trench 250 may sometimes be referred to as a Y-shaped gate trench.

In some embodiments, the upper trench 250U has a width W1 (e.g., a distance between respective opposing upper sidewalls of the second gate spacer 236) at its topmost portion between about 18 nanometers (nm) and about 23 nm, a width W2 at its largest opening (W2>W1) between about 20 nm and about 25 nm, and a depth H1 (e.g., a distance between an upper surface of the second gate spacer 236 and the topmost portion of the first gate spacer 234) between about 30 nm and about 80 nm. The lower trench 250L has a width W3 (e.g., a distance between respective opposing sidewalls of the remaining lower portions of the first gate spacer 234) between about 5 nm and about 10 nm (W2>W1>W3), and has a depth H2 (e.g., a distance between a bottom surface of the gate trench 250 and the topmost portion of the first gate spacer 234) between about 60 nm and about 100 nm. As will be described in subsequent processing, a metal gate is formed in the lower trench 250L in some embodiments. For example, a gate electrode material is used to fill the upper trench 250U and the lower trench 250L and subsequently recessed to keep the gate electrode of the metal gate in the lower trench 250L. Therefore, the size of the lower trench 250L can determine the size of the metal gate and the size of the gate electrode. However, the re-entrant profile of the upper trench 250U may cause seams trapped in the gate trench, causing uneven etching during the metal gate recessing and thus punch-through defects.

Figure 11:
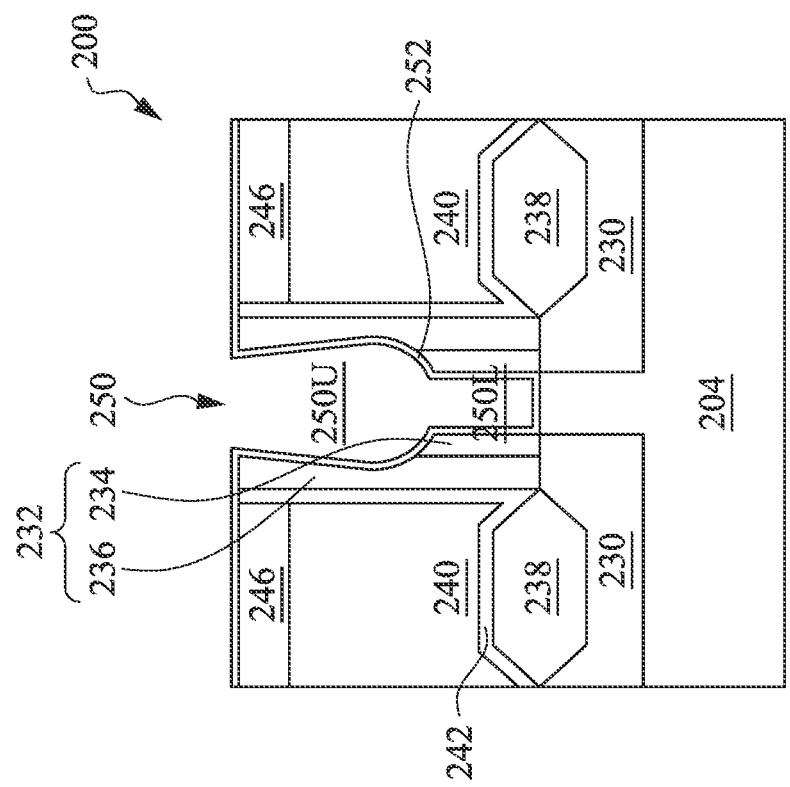

Corresponding to operation 118 of FIG. 2, FIG. 11 is a cross-sectional view of the device 200 including a gate dielectric layer 252 at one of the various stages of fabrication. In some embodiments, the gate dielectric layer 252 is deposited conformally in the gate trench 250, such as on the top surfaces and the sidewalls of the fin 204, on the top surfaces and the sidewalls of the gate spacers 232, and on the top surface of the dielectric layer 246. In accordance with some embodiments, the gate dielectric layer 252 includes silicon oxide, silicon nitride, or multilayers thereof. In example embodiments, the gate dielectric layer 252 includes a high-k dielectric material, and in these embodiments, the gate dielectric layers 252 may have a k value greater than about 7.0, and may include a metal oxide or a silicate of Hf, Al, Zr, La, Mg, Ba, Ti, Pb, and combinations thereof. The formation methods of gate dielectric layer 252 may include molecular beam deposition (MBD), atomic layer deposition (ALD), PECVD, and the like. A thickness of the gate dielectric layer 252 may be between about 8 angstroms (Å) and about 20 angstroms, as an example.

Figure 12:
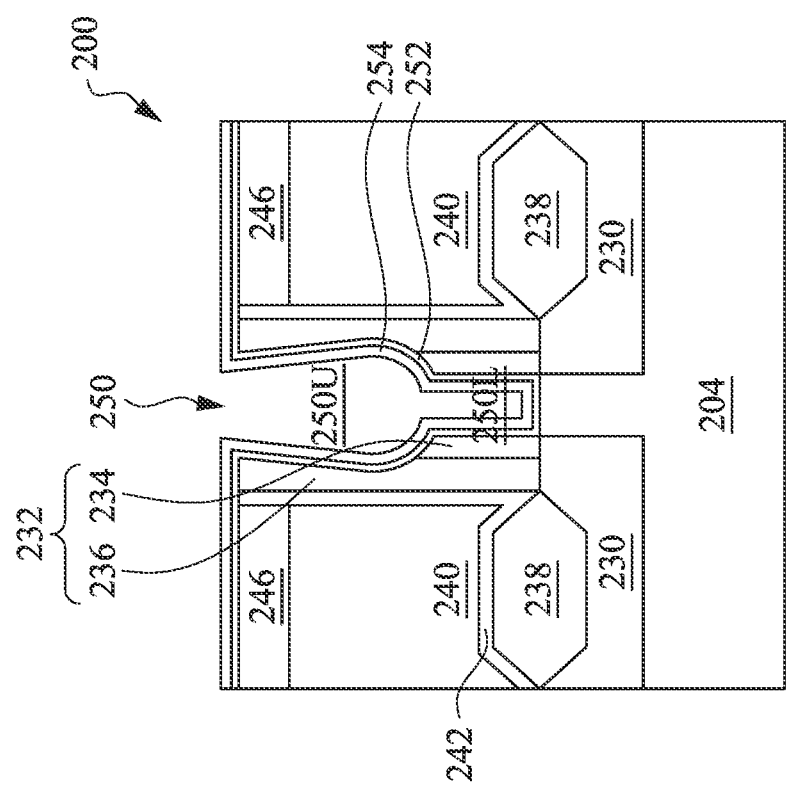

Corresponding to operation 120 of FIG. 2, FIG. 12 is a cross-sectional view of the device 200 including a work function layer 254 at one of the various stages of fabrication. The work function layer 254 is formed (e.g., conformally) over the gate dielectric layer 252. The work function layer 254 may be a P-type work function layer, an N-type work function layer, multi-layers thereof, or combinations thereof, in some embodiments. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), ALD, and/or other suitable process. A thickness of a P-type work function layer may be between about 8 Å and about 15 Å, and a thickness of an N-type work function layer may be between about 15 Å and about 30 Å, as an example.

Figures 13, 14:
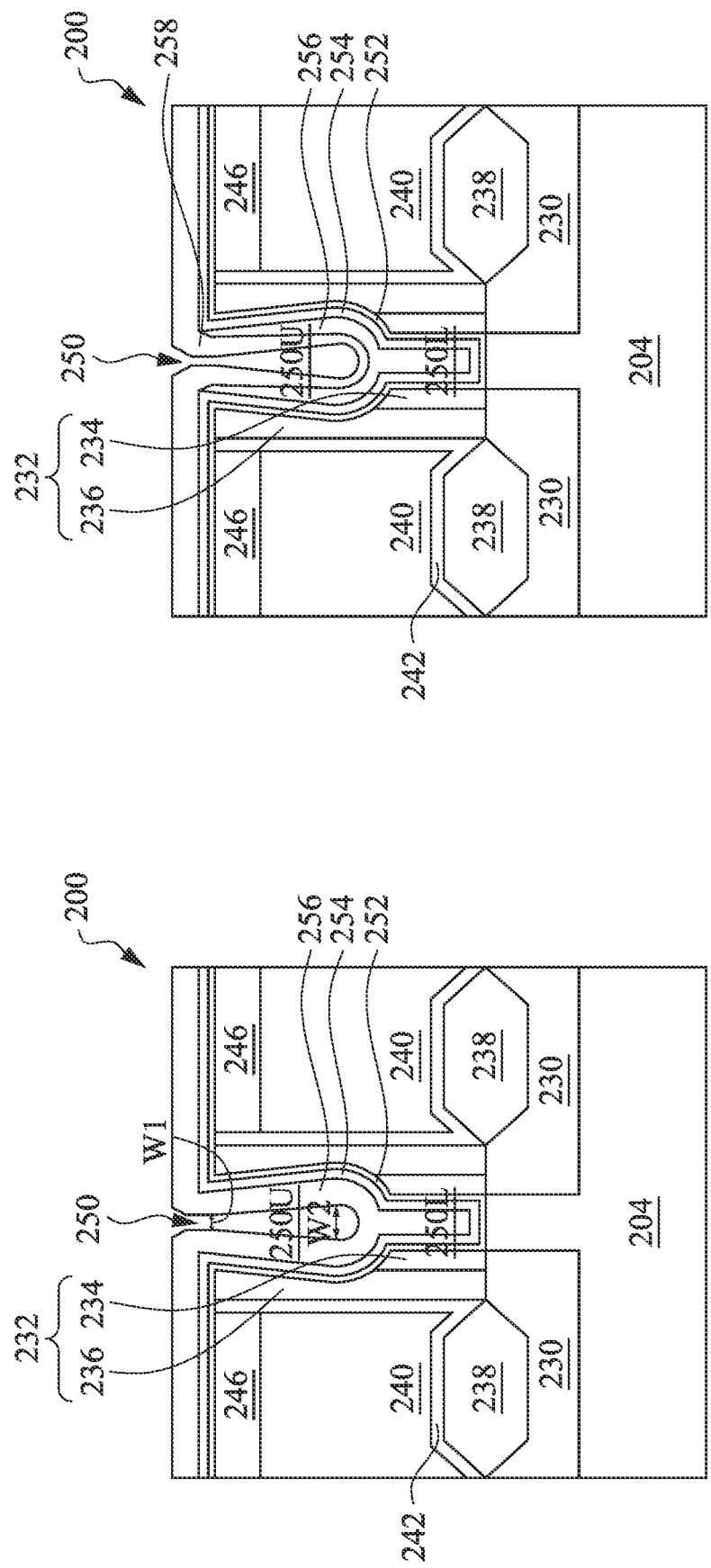

Corresponding to operation 122 of FIG. 2, FIG. 13 is a cross-sectional view of the device 200 including a capping layer 256 at one of the various stages of fabrication. The capping layer 256 is formed (e.g., conformally) over the work function layer 254. The capping layer 256 protects the underlying work function layer 254 from being oxidized. The capping layer 256 may be formed of a suitable material, such as Ta, TaN, Ti, TiN, or TiSiN. In some embodiments, the capping layer 256 is made of TiN. The capping layer 256 may be deposited using a suitable deposition method such as ALD, MBD, CVD, or the like. A thickness of the capping layer 256 may be between about 2 nm and about 5 nm, as an example. The thickness of the capping layer 256 is larger than either of the thickness of the work function layer 254 or the thickness of the gate dielectric layer 252 in some embodiments. In furtherance of some embodiments, the thickness of the capping layer 256 is larger than a sum of the thicknesses of the work function layer 254 and the gate dielectric layer 252, as illustrated in the example of FIG. 13. Depending on the width W3 of the lower trench 250L and the thicknesses of the previously formed layers in the gate trench 250, the capping layer 256 may fill the remaining portions of the lower trench 250L. Depending on the widths W1 and W2 of the upper trench 250U and the previously formed layers in the gate trench 250, the remaining space in the gate trench 250 may have a droplet shape with a narrow opening on the top and a wider opening in the middle, as illustrated in the example of FIG. 13. If one or more layers are further deposited in the gate trench 250, the opening width W1 will soon diminish and seams will be trapped thereunder, which may introduce defects during manufacturing as discussed above.

Corresponding to operation 124 of FIG. 2, FIG. 14 is a cross-sectional view of the device 200 including a passivation layer 258 converted from a surface portion of the capping layer 256 at one of the various stages of fabrication. In some embodiments, the capping layer 256 is a metal or a metal nitride (e.g., Ta, TaN, Ti, TiN, or TiSiN), and the passivation layer 258 is an oxide layer formed by oxidizing the capping layer 256 using any suitable oxidation process such as, but not limited to, air oxidation (i.e., exposure to air), oxygen plasma process (a plasma treatment with $O_2$ and/or $O_3$ as oxidant species), or a wet or dry thermal oxidation. In some embodiments, the capping layer 256 is a metal (e.g., Ta or Ti), and the passivation layer 258 is a nitride layer formed by a nitridation operation using $NH_3$ or $N_2+H_2$ plasma. In an example process, the capping layer 256 is a TiN layer deposited in a deposition chamber and subsequently treated with an oxygen plasma under a thermal environment in a range between 25° C. and 600° C. Still taking oxidation process as an example, the passivation environment is controlled such that oxidant species (e.g., $O_2$ and/or $O_3$) has a higher concentration on the top surface of the device 200 and decreases in a gradient with distance away from the top surface of the device toward the bottom of the gate trench 250. The result is that nearer the top surface of the device 200, a thicker surface portion of the capping layer 256 is oxidized. The thickness of the oxidized capping layer 256 (the thickness of the passivation layer 258) decreases in a gradient as downward into the gate trench 250. Accordingly, the oxidation process is also referred to as a gradient oxidation process. Similarly, in a nitridation process, the thickness of the nitrified capping layer 256 decreases in a gradient as downward into the gate trench 250. Collectively, the passivation process is also referred to as a gradient passivation process. In one example, the portions of the capping layer 256 deposited outside of the gate trench 250 are fully converted to the passivation layer 258, as illustrated in FIG. 14.

Figure 15:
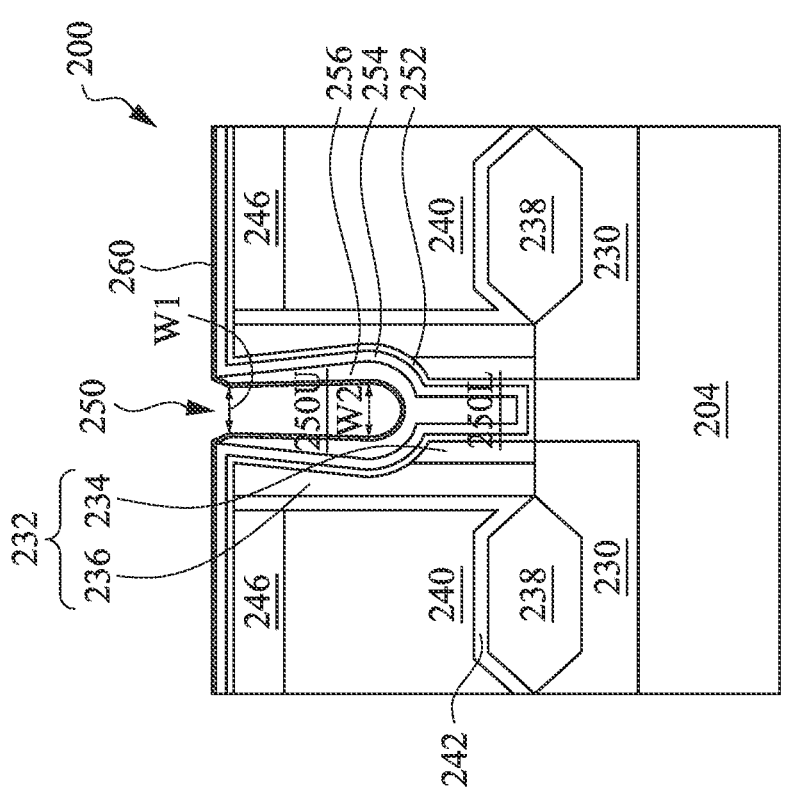
Figure 17:
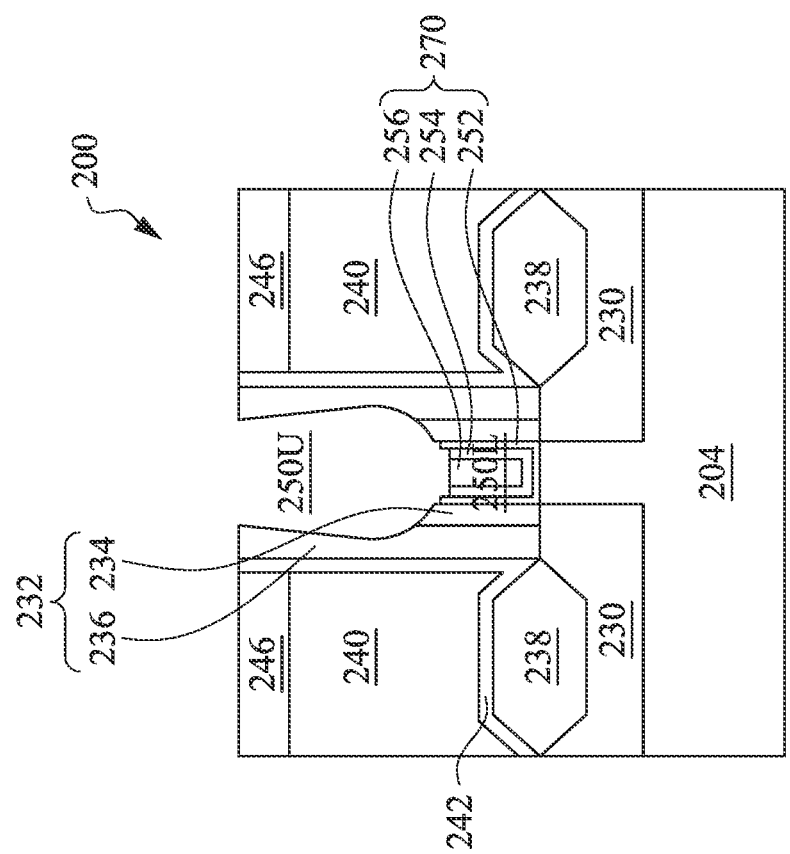

Corresponding to operation 126 of FIG. 2, FIG. 15 is a cross-sectional view of the device 200 after the removal of the passivation layer 258 at one of the various stages of fabrication. In some embodiments, the passivation layer 258 is removed in an etching process, such as a metallic halide etching (MHE) process. An MHE process is a dry etching process using metal-halide etchant (e.g., chlorine-based or fluorine-based etchant). MHE process can efficiently remove overhang at top corners of an opening due to higher reactant molecular density and large contact surface with reactant molecules at the top corners. The MHE process can be performed in-situ (e.g., performed in the same chamber as the deposition process at operation 122 and the passivation process at operation 124). In some embodiments, the chlorine-based or fluorine-based metal precursor for the MHE process can include tungsten fluoride ($WF_6$), tungsten chloride ($WCl_5$), molybdenum pentachloride ($MoCl_5$), titanium chloride ($TiCl_x$), titanium fluoride ($TiF_x$), tantalum chloride ($TaCl_5$), or a combination thereof. Any other suitable precursors can be used. The MHE process can be performed at a temperature between about 200° C. to about 1000° C. The etchant(s) of the MHE process can be pulsed into the reaction chamber at a flow rate of about 100-12000 standard cubic centimeters per minute (sccm). The processing pressure for the MHE process can be between about 1 Torr and about 20 Torr. The MHE process can be performed for a period of time between about 10 s and about 300 s. After the gradient passivation process at operation 124 and the etching process at operation 126, the opening W1 of the upper trench 250U is expanded. The expanded upper trench 250U may have a U-shape with substantially vertical sidewalls (W1≈W2), as illustrated in FIG. 15. In another example, the expanded upper trench 250U may have a V-shape with tapered sidewalls (W1>W2).

A thin film 260 containing the residue metal element may be formed on the previous interface between the remaining capping layer 256 and the removed passivation layer 258. A thickness of the thin film 260 may be between about 2 Å and about 10 Å, as an example. The residue metal element is from the metal elements used in the metal-halide etchant. For example, a thin film containing tungsten may be formed and covering the capping layer 256. For another example, a thin film containing molybdenum may be formed and covering the capping layer 256. The thin film 260 may be in contact with the work function layer 254 outside the gate trench 250 due to the complete passivation and removal of the capping layer 256 outside the gate trench 250 in some embodiments, as illustrated in FIG. 15. The metal residue in the thin film 260 may diffuse into the capping layer 256 with a decreasing gradient as further into the capping layer 256. The concentration of the metal residue decreases to zero before reaching the interface between the capping layer 256 and the work function layer 254. A thickness of the metal-containing thin film 260 may be between about 1 Å and about 5 Å.

Figure 16:
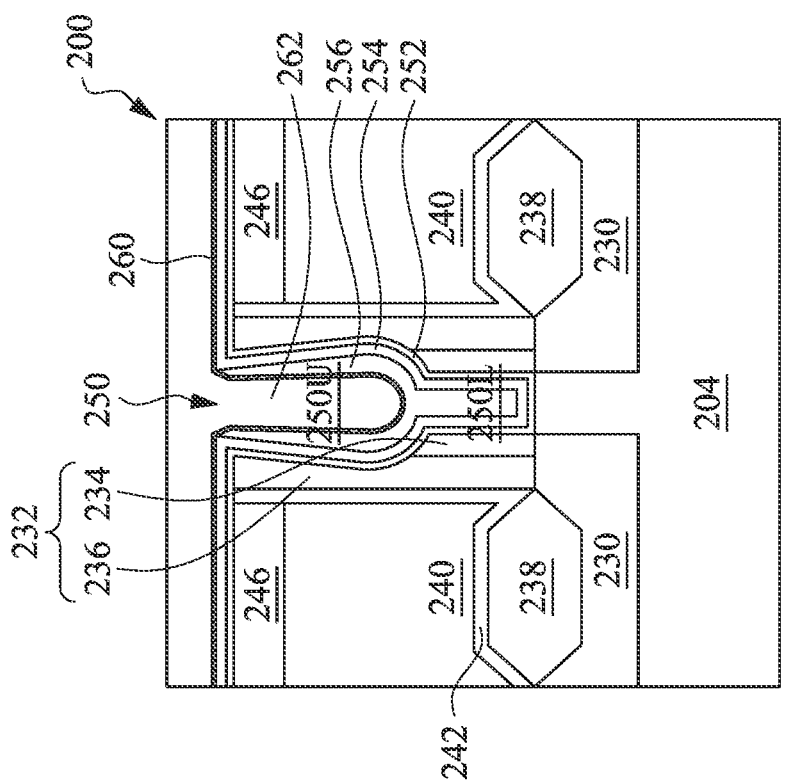

Corresponding to operation 128 of FIG. 2, FIG. 16 is a cross-sectional view of the device 200 including a gap-filling layer 262 (or referred to as a trench-filling layer or fill layer 262) at one of the various stages of fabrication. The gap-filling layer 262 is formed over the capping layer 256 (and the metal-containing thin film 260 if formed). The gap-filling layer 262 is deposited on the top surface of the device 200 and fills remaining portions of the upper trench 250U. The gap-filling layer 262 may be formed of a suitable material, such as titanium nitride, silicon nitride, tungsten, cobalt, or a combination thereof, using a suitable deposition method such as CVD, PVD, ALD, or the like. The expanded upper trench 250U facilitates the deposition of the gap-filling layer 262, such that the filled upper trench 250U is substantially free of seams (or less seams). In one example, the capping layer 256 and the gap-filling layer 262 includes different material compositions, such as TiN in the capping layer 256 and SiN in the gap-filling layer 262. In another example, the capping layer and the gap-filling layer 262 includes similar material composition, such as TiN in both layers, but different in nitrogen concentration (e.g, higher nitrogen concentration in the gap-filling layer 262). In yet another example, the capping layer 256 and the gap-filling layer 262 include the same material composition, but deposited by different methods (e.g., ALD for the capping layer 256 and CVD for the gap-filling layer 262), resulting in different grain sizes (e.g., smaller grain size in the capping layer 256). A planarization process, such as a CMP process, is performed to remove the excessive portion of the gap-filling layer 262 (as well as the horizontal portion of the metal-containing thin film 260, the work function layer 254, and the gate dielectric layer 252) to expose the top surface of the dielectric layer 246 and the gate spacers 232. The resultant structure after the planarization process is illustrated as in FIG. 17.

Figure 18:
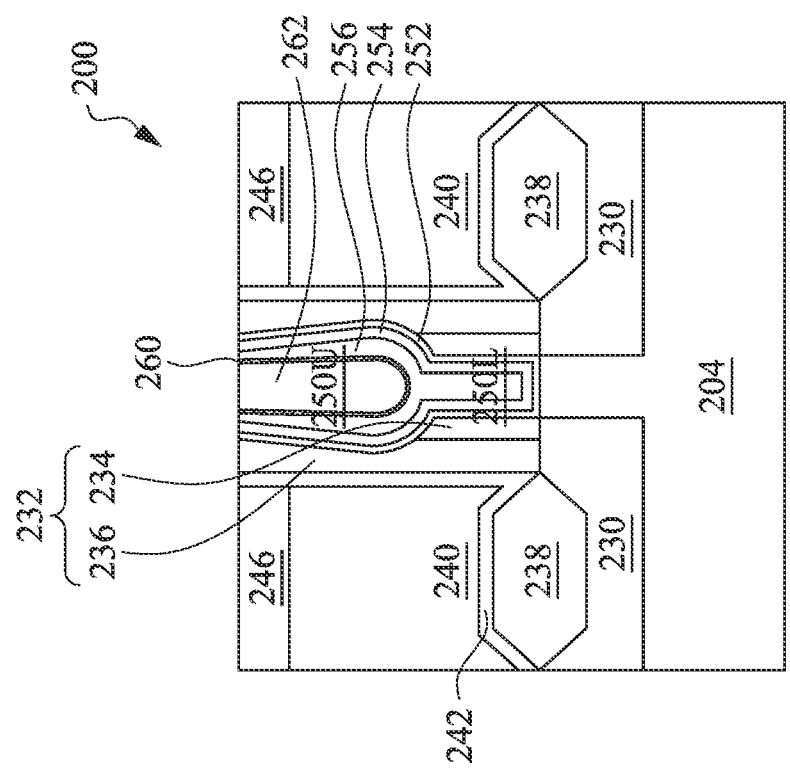

Corresponding to operation 130 of FIG. 2, FIG. 18 is a cross-sectional view of the device 200 after a metal gate pull-back process is performed at one of the various stages of fabrication. In some embodiments, material layers (layers 252, 254, 256, 260, and 262) in the upper trench 250U are removed in the metal-gate pull-back process, such that the sidewalls of the second gate spacers 236 are exposed again. As illustrated in FIG. 18, the remaining portions of the gate dielectric layer 252, the work function layer 254, and the capping layer 256 are recessed below a topmost portion of the first gate spacers 234. The gate dielectric layer 252, the work function layer 254, and the capping layer 256 in the lower trench 250L can present a concave upper surface, such that a topmost portion of the gate dielectric layer 252 is above a topmost portion of the work function layer 254 that is further above a topmost portion of the capping layer 256. In some embodiments, the remaining portions of the various layers in the lower trench 250L, such as the gate dielectric layer 252, the work function layer 254, and the capping layer 256 can at least partially form a metal gate 270. Since the metal-containing thin film 260 and the gap-filling layer 262 are formed in the upper trench 250U, the metal gate 270 may be free of the metal-containing thin film 260 and the gap-filling layer 262 after the metal gate pull-back process. In some embodiments, the metal gate pull-back process includes a selective wet etch process without substantially attacking the gate spacers 232. The wet etch process is performed using a chemical including an acid and an oxidizer, in some embodiments. For example, the chemical used may be a mixture of hydrochloric acid (HCl) and hydrogen peroxide ($H_2O_2$), where HCl functions as the acid and $H_2O_2$ functions as the oxidizer. In some embodiments, a mixing ratio (e.g., volume ratio) between HCl and $H_2O_2$ is between about 1:1 and 1:20 for the wet etch process. The wet etch process may be performed at a temperature between about 40° C. and about 70° C. for a duration between about 1 minute and about 5 minutes.

Figures 19, 20:
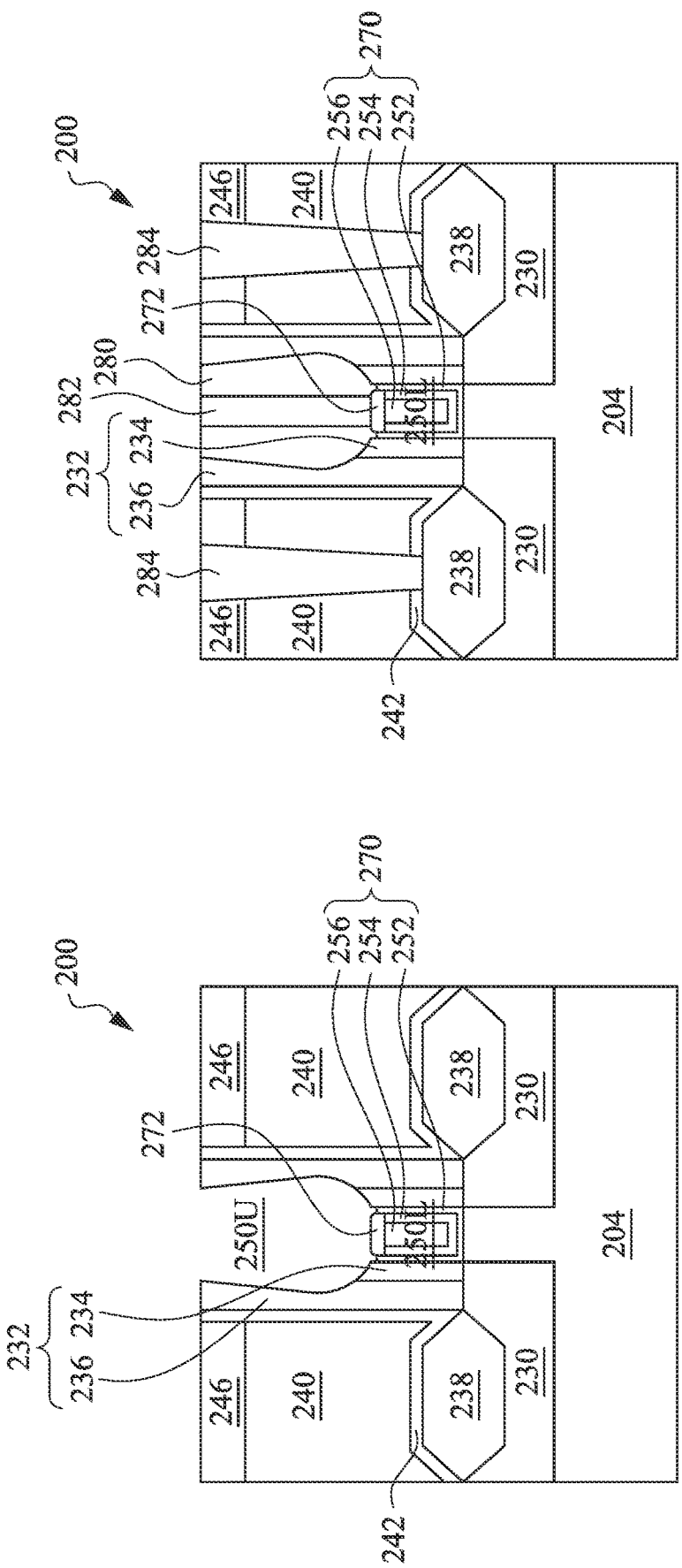

Corresponding to operation 132 of FIG. 2, FIG. 19 is a cross-sectional view of the device 200 in which a contact metal layer (or referred to as a gate metal cap) 272 is formed at one of the various stages of fabrication. The contact metal layer 272 is formed over the recessed layers. In some embodiments, the contact metal layer 272 includes W, Ta, Sn, Nb, Ru, Co or Mo. In some embodiments, the contact metal layer 272 is formed by an ALD process using metal halide (chloride) gases (e.g., $TaCl_5$, $SnCl_4$, $NbCl_5$ or $MoCl_4$). In some embodiments, the contact metal layer 272 includes fluorine-free metal, for example, fluorine-free W formed by $WCl_5$ as a source gas. In some embodiments, the ALD process is a selective deposition process combined with an etching process such that the contact metal layer 272 selectively grows from metallic under-layers, such as, the capping layer 256 and the work function layer 254, and no metal layer is grown from the gate dielectric layer 252. The selective growth leaves a gap laterally between the contact metal layer and the first gate spacers 234, preventing metal elements from diffusing into the first gate spacers 234. In some embodiments, the thickness of the contact metal layer 272 is in a range from about 1 nm to about 10 nm. In some embodiments, the upper surface of the contact metal layer 272 is below the topmost portion of the first gate spacers 234. In some embodiments, the contact metal layer 272 is thick enough, such that the upper surface of the contact metal layer 272 is above the topmost portion of the first gate spacers 234. In some embodiments, the deposition of the contact metal layer 272 includes a cleaning operation interposed between two or more deposition processes. In some embodiments, the cleaning operation includes a hot water cleaning (e.g., 80° C. or more) and/or an oxygen treatment.

Corresponding to operation 134 of FIG. 2, FIG. 20 is a cross-sectional view of the device 200 with further fabrication processes are performed. For example, a gate cap insulating layer 280 is formed over the contact metal layer 272. In some embodiments, the gate cap insulating layer 280 includes silicon nitride, SiON, SiOCN, a low-k dielectric material, or any other suitable material, using a suitable formation method such as PVD, CVD, or the like. Further, a gate contact (also referred to as contact plugs) 282 is formed in (e.g., to extend through) the gate cap insulating layer 280 to electrically couple to the contact metal layer 272. In the above example where the gate cap insulating layer 280 is deposited prior to forming the gate contact 282, a contact opening is formed in the gate cap insulating layer 280 to expose the contact metal layer 272, using, e.g., photolithography and etching. Once the contact opening is formed, a barrier layer, a seed layer, and a fill metal (not shown) are formed successively in the contact opening to form the gate contact 282.

Still referring to FIG. 20, source/drain contacts 284 are formed in the ILD 240 to electrically couple to the source/drain regions 238. In some embodiments, an etching process etches through the dielectric layer 246 and the ILD 240 to form contact openings that expose the S/D regions 238. A silicide feature (not shown) is formed above the S/D regions 238 in a silicide formation process. The silicide feature may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), a combination thereof, or other suitable compounds. Subsequently, the source/drain contacts 284 are formed in the contact openings and land on the silicide feature by depositing a conductive material in the contact openings. The conductive material may include any suitable material, such as W, Co, Ru, Cu, Ta, Ti, Al, Mo, other suitable conductive materials, or combinations thereof, and may be deposited by any suitable method, such as CVD, PVD, ALD, plating, other suitable methods, or combinations thereof. Alternatively, the silicide formation may be skipped and the source/drain contacts 284 directly contact the source/drain regions 238.

Figure 21:
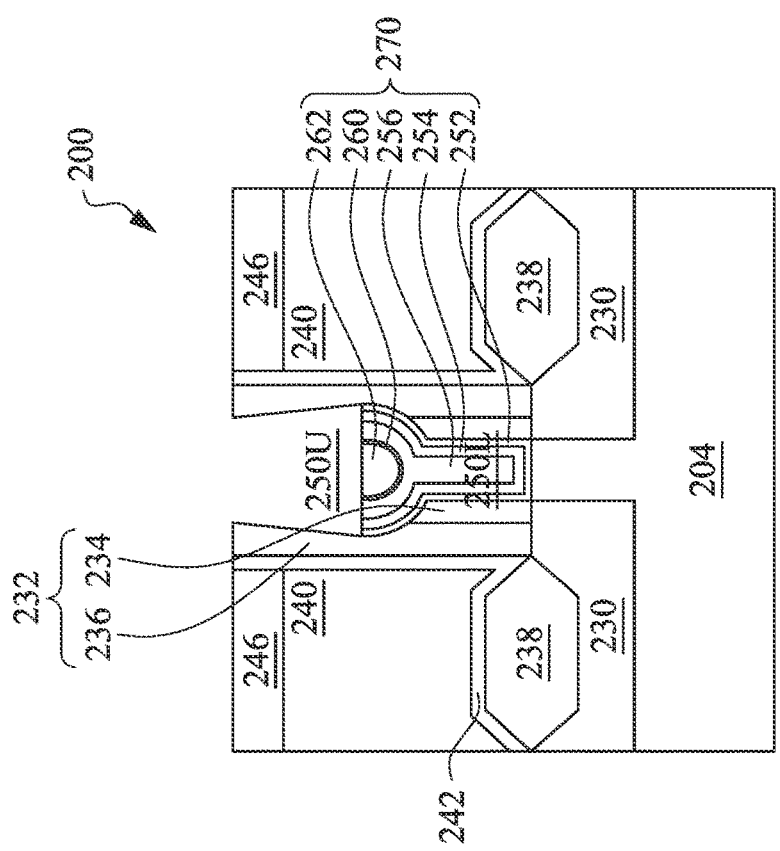
FIGS. 21, 22, and 23 illustrate cross-sectional views of another example multi-gate transistor device, in accordance with some embodiments.
Figure 22:
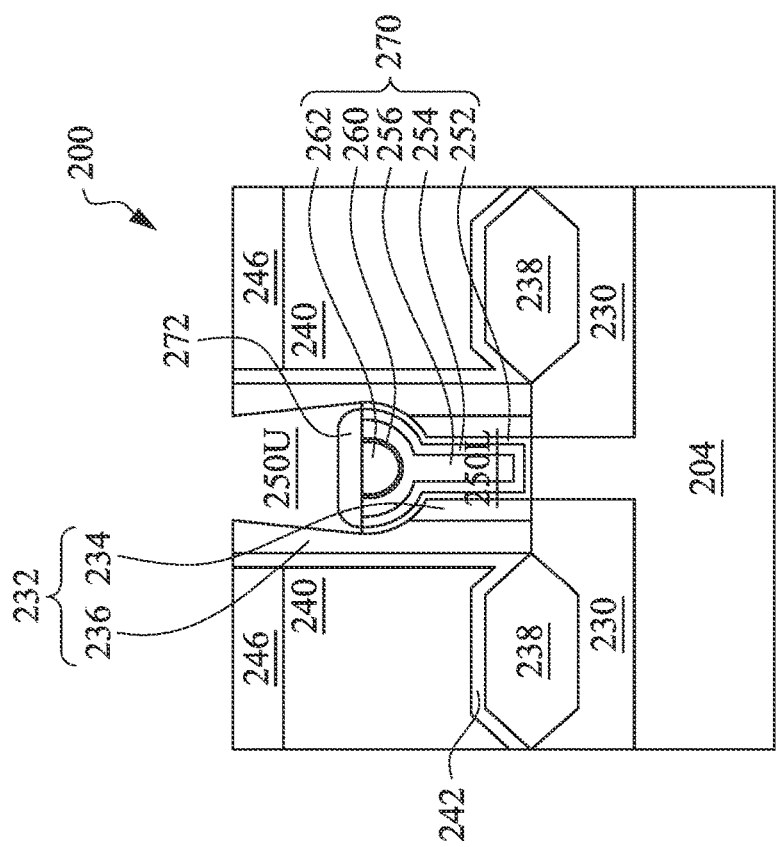
Figure 23:
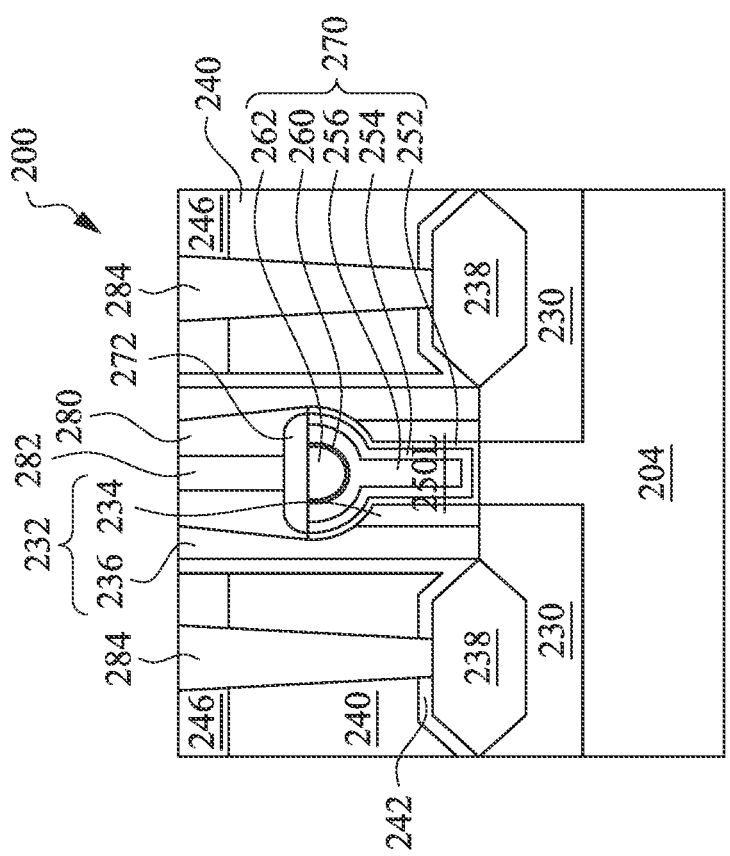

FIGS. 21-23 illustrate an alternative embodiment of the device 200. Corresponding to operation 130 of FIG. 2, FIG. 21 is an alternative cross-sectional view of the device 200 after a metal gate pull-back process is performed at one of the various stages of fabrication. In some embodiments, material layers (layers 252, 254, 256, 260, and 262) in the upper trench 250U are partially removed in the metal-gate pull-back process, such that bottom portions of the upper trench 250U are still filled. The remaining portions of the various layers in the lower trench 250L, such as the gate dielectric layer 252, the work function layer 254, the capping layer 256, the metal-containing thin film 260, and the gap-filling layer 262, can at least partially form a metal gate 270. The metal gate 270 may present a concave upper surface. Nonetheless, the concave upper surface, and corresponding topmost portions of the gate dielectric layer 252, the work function layer 254, the capping layer 256, the metal-containing thin film 260, and the gap-filling layer 262, are all above the topmost portion of the first gate spacers 234. The metal-containing thin film 260 may include a metal element different from those in forming the capping layer 256 and the gap-filling layer 262. This metal-containing thin film may serve as a detectable tracer for identifying whether a gradient passivation process has been applied during metal gate formation.

Corresponding to operation 132 of FIG. 2, FIG. 22 is an alternative cross-sectional view of the device 200 in which a contact metal layer 272 is formed at one of the various stages of fabrication. The contact metal layer 272 is formed over the recessed layers. In some embodiments, the contact metal layer 272 includes W, Ta, Sn, Nb, Ru, Co or Mo. In some embodiments, the contact metal layer 272 is formed by an ALD process using metal halide (chloride) gases (e.g., $TaCl_5$, $SnCl_4$, $NbCl_5$ or $MoCl_4$). In some embodiments, the contact metal layer 272 includes fluorine-free metal, for example, fluorine-free W formed by $WCl_5$ as a source gas. In some embodiments, the ALD process is a selective deposition process combined with an etching process such that the contact metal layer 272 selectively grows from metallic under-layers, such as, the capping layer 256 and the work function layer 254, and no metal layer is grown from the gate dielectric layer 252. The selective growth leaves a gap laterally between the contact metal layer and the first gate spacers 234, preventing metal elements from diffusing into the first gate spacers 234. In some embodiments, the thickness of the contact metal layer 272 is in a range from about 1 nm to about 10 nm. The bottom surface of the contact metal layer 272 is above the topmost portion of the first gate spacers 234.

Corresponding to operation 134 of FIG. 2, FIG. 23 is an alternative cross-sectional view of the device 200 with further fabrication processes are performed. The method 100 at operation 134 may form the gate cap insulating layer 280, the gate contact 282, and the source/drain contacts 284, similarly as what have been discussed above.

Figure 24:
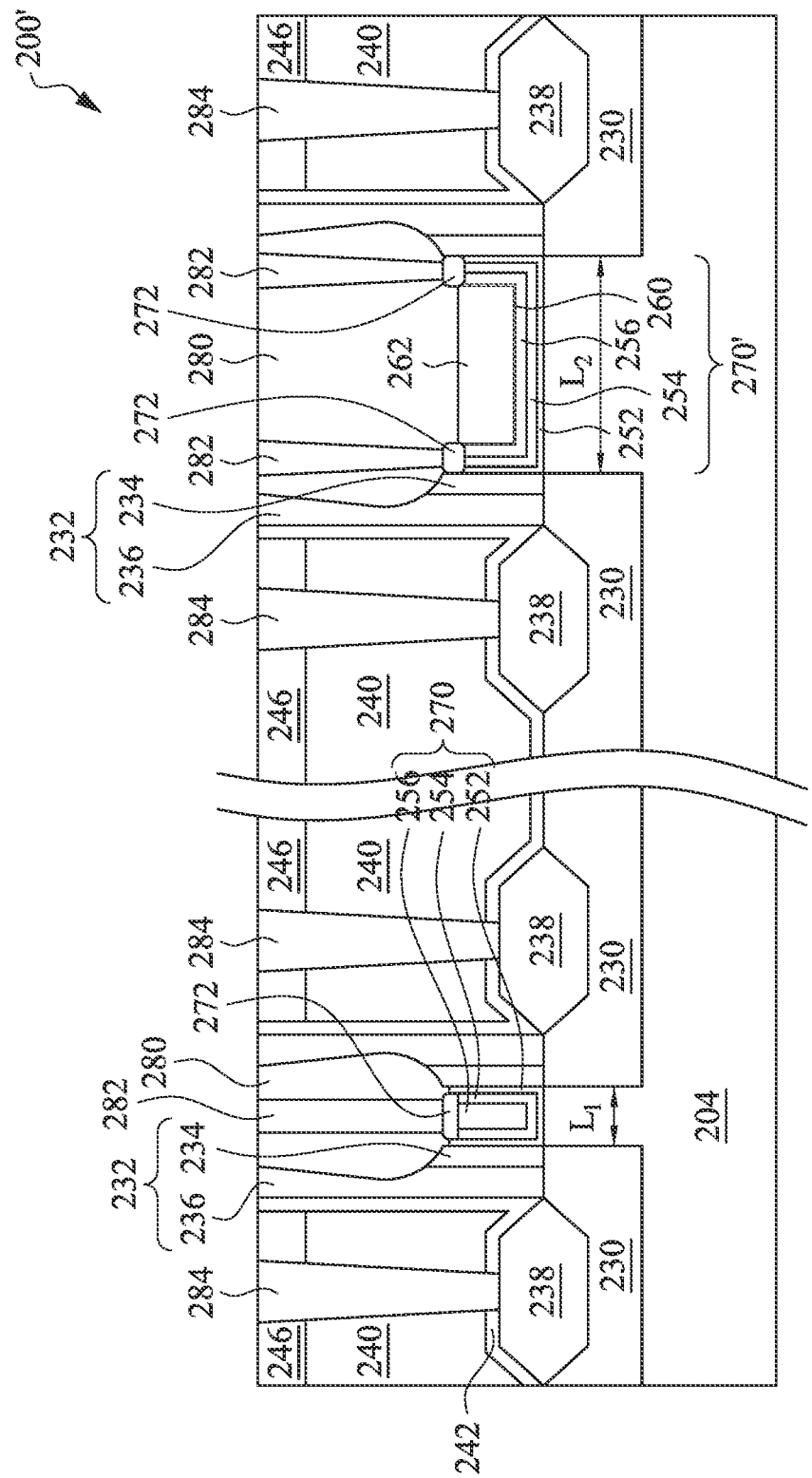
FIG. 24 illustrates a cross-sectional view of yet another example multi-gate transistor device, in accordance with some embodiments.

Referring to FIG. 24, a cross-sectional view of portions of a device 200' is shown. The device 200' is substantially similar to the device 200 shown in FIG. 20, but with an additional metal gate 270'. As shown, the metal gate 270 is substantially the same as the metal gate 270 in FIG. 20, which extends over a distance that defines a channel length, $L_1$, of a corresponding transistor. The metal gate 270', however, extends over a distance that defines a channel length, $L_2$, which is substantially greater than $L_1$. Such a transistor with the relatively short channel length (e.g., the transistor having the metal gate 270) may sometimes be referred to as a short-channel transistor; and such a transistor with the relatively long channel length (e.g., the transistor having the metal gate 270') may sometimes be referred to as a long-channel transistor. In the example of the long-channel transistor, the metal gate 270' may further include the metal-containing thin film 260 and the gap-filling layer 262 that are also deposited in the lower trench 250L, which is due to the relatively long channel length such that the capping layer 256 does not fill up the lower trench 250L but with a U-shape. The metal-containing thin film 260 and the gap-filling layer 262 are thus formed in the remaining portions of the lower trench 250L that are surrounded by the capping layer 256. Each of layers 252, 254, 256, 260, and 262 may be below the topmost portion of the first gate spacer 234. Further, the metal gate 270' can include an additional contact metal layer 272. Each of the contact metal layer 272 electrically couples to one of the ends of a combination of the U-shaped layers 252, 254, 256, and 260. Accordingly, one or more gate contacts 282 may be formed to couple the contact metal layer 272.

Although not intended to be limiting, one or more embodiments of the present disclosure provide many benefits to a semiconductor device and the formation thereof.

For example, embodiments of the present disclosure provide a gradient passivation and etching process to enlarge a gate trench. The enlarged gate trench facilitates the subsequent material layer deposition without trapping seams in the gate trench, which increases device performance after a metal gate pull-back process. Further, the proposed operations in metal gate formation can be easily integrated into existing semiconductor fabrication processes.

In one exemplary aspect, the present disclosure is directed to a method of manufacturing a semiconductor device. The method includes forming a gate trench over a semiconductor substrate, depositing a gate dielectric layer and a work function layer in the gate trench, depositing a capping layer over the work function layer, passivating a surface portion of the capping layer to form a passivation layer, removing the passivation layer, depositing a fill layer in the gate trench, recessing the fill layer and the capping layer, and forming a contact metal layer above the capping layer in the gate trench. In some embodiments, the passivating of the surface portion of the capping layer includes an oxidation process and the passivation layer is an oxide. In some embodiments, the oxidation process is an oxygen plasma process. In some embodiments, the passivating of the surface portion of the capping layer includes a nitridation process and the passivation layer is a nitride. In some embodiments, the passivating of the surface portion of the capping layer includes applying a passivating species that has a higher concentration at an opening of the gate trench than at a bottom portion of the gate trench. In some embodiments, the passivation layer has a larger thickness near an opening of the gate trench than near a bottom portion of the gate trench. In some embodiments, after the removing of the passivation layer, an opening of the gate trench is enlarged. In some embodiments, the removing of the passivation layer forms a metal-containing film on the capping layer. In some embodiments, the metal-containing film includes a metal element that is not included in the capping layer and the fill layer. In some embodiments, the recessing of the fill layer and the capping layer fully removes the fill layer from the gate trench.

In another exemplary aspect, the present disclosure is directed to a method of fabricating a semiconductor device. The method includes forming a gate trench in a dielectric material by removing a dummy gate and by removing an upper portion of a gate spacer disposed on sidewalls of the dummy gate, depositing a gate dielectric layer and a work function layer in the gate trench, depositing a capping layer in the gate trench, performing a passivation treatment to the capping layer to convert a surface portion of the capping layer to a passivation layer, etching the passivation layer, thereby enlarging an opening of the gate trench, and depositing a trench-filling layer in the gate trench. In some embodiments, the trench-filling layer fully fills the gate trench without trapping seams in the gate trench. In some embodiments, the passivation layer includes a larger thickness close to the opening of the gate trench than close to a bottom portion of the gate trench. In some embodiments, the method further includes recessing the trench-filling layer, the capping layer, the work function layer, and the gate dielectric layer, and forming a contact metal layer directly above the capping layer and the work function layer in the gate trench. In some embodiments, the recessing fully removes the trench-filling layer from the gate trench. In some embodiments, prior to the depositing of the gate dielectric layer and the work function layer, the gate trench includes a lower trench and an upper trench above the lower trench, the upper trench is wider than the lower trench. In some embodiments, prior to the depositing of the gate dielectric layer and the work function layer, the opening of the gate trench is smaller than a middle portion of the upper trench, and after the etching of the passivation layer, the opening of the gate trench is larger than the middle portion of the upper trench.

In yet another exemplary aspect, the present disclosure is directed to a semiconductor device. The semiconductor device includes a fin protruding from a substrate, first and second source/drain regions over the fin, a metal gate over the fin and sandwiched between the first and second source/drain regions, and a gate spacer disposed on sidewalls of the metal gate. The metal gate includes a gate dielectric layer, a work function layer over the gate dielectric layer, a capping layer over the work function layer, a metal-containing film surrounded by the capping layer, and a fill layer surrounded by the metal-containing film. In some embodiments, the gate spacer has a bottom portion wider than a top portion. In some embodiments, the metal-containing film includes a metal element that is not included in the capping layer and the fill layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a gate trench over a semiconductor substrate;
   depositing a gate dielectric layer and a work function layer in the gate trench;
   depositing a capping layer over the work function layer;
   passivating a surface portion of the capping layer to form a passivation layer;
   removing the passivation layer, wherein the removing of the passivation layer forms a metal-containing film on the capping layer;
   depositing a fill layer in the gate trench;
   recessing the fill layer and the capping layer; and
   forming a contact metal layer above the capping layer in the gate trench.

2. The method of claim 1, wherein the passivating of the surface portion of the capping layer includes an oxidation process and the passivation layer is an oxide.

3. The method of claim 2, wherein the oxidation process is an oxygen plasma process.

4. The method of claim 1, wherein the passivating of the surface portion of the capping layer includes a nitridation process and the passivation layer is a nitride.

5. The method of claim 1, wherein the passivating of the surface portion of the capping layer includes applying a passivating species that has a higher concentration at an opening of the gate trench than at a bottom portion of the gate trench.

6. The method of claim 1, wherein the passivation layer has a larger thickness near an opening of the gate trench than near a bottom portion of the gate trench.

7. The method of claim 1, wherein after the removing of the passivation layer, an opening of the gate trench is enlarged.

8. The method of claim 1, wherein the metal-containing film includes a metal element that is not included in the capping layer and the fill layer.

9. The method of claim 1, wherein the recessing of the fill layer and the capping layer fully removes the fill layer from the gate trench.

10. The method of claim 1, wherein the metal-containing film contains tungsten.

11. A method of manufacturing a semiconductor device, comprising:
- forming a gate trench in a dielectric material by removing a dummy gate and by removing an upper portion of a gate spacer disposed on sidewalls of the dummy gate;
- depositing a gate dielectric layer and a work function layer in the gate trench;
- depositing a capping layer in the gate trench;
- performing a passivation treatment to the capping layer to convert a surface portion of the capping layer to a passivation layer, wherein the passivation layer includes a larger thickness close to an opening of the gate trench than close to a bottom portion of the gate trench;
- etching the passivation layer, thereby enlarging the opening of the gate trench; and
- depositing a trench-filling layer in the gate trench.

12. The method of claim 11, wherein the trench-filling layer fully fills the gate trench without trapping seams in the gate trench.

13. The method of claim 11, further comprising:
- recessing the trench-filling layer, the capping layer, the work function layer, and the gate dielectric layer; and
- forming a contact metal layer directly above the capping layer and the work function layer in the gate trench.

14. The method of claim 13, wherein the recessing fully removes the trench-filling layer from the gate trench.

15. The method of claim 11, wherein prior to the depositing of the gate dielectric layer and the work function layer, the gate trench includes a lower trench and an upper trench above the lower trench, the upper trench is wider than the lower trench.

16. The method of claim 15, wherein prior to the depositing of the gate dielectric layer and the work function layer, the opening of the gate trench is smaller than a middle portion of the upper trench, and wherein after the etching of the passivation layer, the opening of the gate trench is larger than the middle portion of the upper trench.

17. The method of claim 11, wherein the capping layer contains a metal element.

18. A method, comprising:
- forming a dummy gate structure;
- depositing a first gate spacer on sidewalls of the dummy gate structure;
- depositing a second gate spacer on sidewalls of the first gate spacer, wherein the first and second gate spacers include different material compositions;
- removing the dummy gate structure and a top portion of the first gate spacer to form a gate trench, wherein the gate trench exposes a top portion of the second gate spacer;
- depositing a gate dielectric layer and a work function layer in the gate trench;
- depositing a capping layer over the work function layer;
- passivating a surface portion of the capping layer to form a passivation layer, wherein the passivation layer has a larger thickness near an opening of the gate trench than near a bottom portion of the gate trench;
- removing the passivation layer;
- recessing the gate dielectric layer, the work function layer, and the capping layer to expose the second gate spacer in the gate trench; and
- forming a gate contact in electrical coupling with the recessed capping layer and the work function layer.

19. The method of claim 18, further comprising:
- after the removing of the passivation layer, depositing a gap-filling layer in the gate trench.

20. The method of claim 19, wherein a bottommost potion of the gap-filling layer is above a topmost portion of the first gate spacer.

* * * * *